(12) United States Patent
Suzuki

(10) Patent No.: US 8,470,699 B2
(45) Date of Patent: Jun. 25, 2013

(54) METHOD OF MANUFACTURING SILICON CARBIDE SEMICONDUCTOR APPARATUS

(75) Inventor: Kenji Suzuki, Narita (JP)

(73) Assignee: Showa Denko K.K., Tokyo (JP)

( * ) Notice: Subject to any disclaimer, the term of this patent is extended or adjusted under 35 U.S.C. 154(b) by 86 days.

(21) Appl. No.: 13/141,275

(22) PCT Filed: Nov. 9, 2009

(86) PCT No.: PCT/JP2009/005966
§ 371 (c)(1),
(2), (4) Date: Jun. 21, 2011

(87) PCT Pub. No.: WO2010/073469
PCT Pub. Date: Jul. 1, 2010

(65) Prior Publication Data
US 2011/0287618 A1    Nov. 24, 2011

(30) Foreign Application Priority Data
Dec. 26, 2008    (JP) ................................. 2008-333658

(51) Int. Cl.
H01L 21/265    (2006.01)
(52) U.S. Cl.
USPC ............ 438/518; 438/522; 438/779; 438/931
(58) Field of Classification Search
None
See application file for complete search history.

(56) References Cited

U.S. PATENT DOCUMENTS

| | | | |
|---|---|---|---|
| 6,294,444 B1 | 9/2001 | Ueno | |
| 2006/0220027 A1* | 10/2006 | Takahashi et al. | 257/77 |
| 2007/0015373 A1* | 1/2007 | Cowen et al. | 438/758 |
| 2007/0167026 A1* | 7/2007 | Miura | 438/758 |
| 2008/0001158 A1 | 1/2008 | Das et al. | |
| 2008/0090383 A1* | 4/2008 | Nakamura et al. | 438/465 |
| 2008/0132047 A1* | 6/2008 | Dunne et al. | 438/527 |
| 2009/0042375 A1 | 2/2009 | Sawada et al. | |

FOREIGN PATENT DOCUMENTS

| | | |
|---|---|---|
| EP | 1494268 A2 | 1/2005 |
| EP | 1713117 A1 | 10/2006 |
| JP | 2000-036470 A | 2/2000 |
| JP | 2001-068428 A | 3/2001 |
| JP | 2004-363326 A | 12/2004 |
| JP | 2005-353771 A | 12/2005 |
| JP | 2007-281005 A | 10/2007 |
| JP | 2009-065112 A | 3/2009 |
| WO | 2005/076327 A1 | 8/2005 |

OTHER PUBLICATIONS

Extended European Search Report dated Oct. 30, 2012 for corresponding European Patent Application No. 09834285.0.

* cited by examiner

*Primary Examiner* — Scott B Geyer
(74) *Attorney, Agent, or Firm* — Sughrue Mion, PLLC

(57) ABSTRACT

Disclosed is a method of manufacturing a silicon carbide semiconductor apparatus which provides a smooth silicon carbide surface while maintaining a high impurity activation ratio. The method of manufacturing a silicon carbide semiconductor apparatus which forms an impurity region in the surface layer of a silicon carbide substrate includes the steps of implanting an impurity into the surface layer of the silicon carbide substrate, forming a carbon film on the surface of the silicon carbide substrate, preliminarily heating the silicon carbide substrate with the carbon film as a protective film, and thermally activating the silicon carbide substrate with the carbon film as a protective film.

6 Claims, 5 Drawing Sheets

METHOD OF MANUFACTURING SILICON CARBIDE SEMICONDUCTOR APPARATUS

CROSS REFERENCE TO RELATED APPLICATIONS

This application is a National Stage of International Application No. PCT/JP2009/005966 filed Nov. 9, 2009, claiming priority based on Japanese Patent Application No. 2008-333658, filed Dec. 22, 2008, the contents of all of which are incorporated herein by reference in their entirety.

TECHNICAL FIELD

The present invention relates to a method of manufacturing a silicon carbide semiconductor apparatus.

BACKGROUND ART

A silicon carbide semiconductor has excellent characteristics compared to a silicon semiconductor, such as a high dielectric breakdown voltage, a wide energy bandgap, and high thermal conductivity, and it is hoped that it can be applied to light-emitting devices, high-power power devices, high-temperature-tolerant devices, radiation-proof devices, high-frequency devices, or the like.

In forming a device (SiC semiconductor device) using the silicon carbide semiconductor, for example, it is necessary that an epitaxial growth layer be formed on a silicon carbide substrate (SiC substrate) as an active region of a semiconductor device, and the conduction type or carrier concentration be controlled in a selected region of the epitaxial growth layer. Impurity dopant atoms are partially implanted into the epitaxial growth layer serving as the active region, making it possible to form various p-type or n-type impurity-doped regions and to form a semiconductor device, such as a transistor or a diode.

On the other hand, in order to activate the impurities ion-implanted into the active region of the silicon carbide substrate, it is necessary to carry out annealing treatment at a very high temperature (for example, 1600° C. to 2000° C.). It is known that the annealing treatment at high temperature causes Si atoms in the silicon carbide substrate surface to become vaporized, causing the surface to become rich in carbon (hereinafter, referred to as C). For this reason, surface roughness or bunching occurs, adversely affecting the device characteristics. Accordingly, even when a transistor or a diode is formed using the silicon carbide substrate having such a surface, there is a problem in that it is difficult to obtain electrical characteristics which are expected from the excellent characteristic values inherent in SiC.

Accordingly, a high-temperature annealing treatment method has been suggested which is capable of controlling the surface roughness of the silicon carbide substrate (Patent Literature 1 to 5). Specifically, in a method of manufacturing a silicon carbide semiconductor apparatus described in Patent Literature 1, a high-temperature annealing treatment method is described in which a diamond-like carbon (DLC) film or an organic film is deposited as a protective film on an epitaxial layer serving as an active region and subjected to activation annealing, thereby suppressing the surface roughness of the SiC substrate.

In a method of manufacturing a silicon carbide semiconductor apparatus described in Patent Literature 2, a high-temperature annealing treatment method is described in which the above-described protective film is not provided, and a preliminary heat treatment is carried out before a high-temperature annealing treatment, thereby preventing the occurrence of surface roughness.

In a method of manufacturing a silicon carbide semiconductor device described in Patent Literature 3, a high-temperature annealing treatment method is described in which a new protective film is not deposited on the surface of a substrate, and the silicon carbide substrate is heated to form a carbon protective film 5 on the surface of the silicon carbide substrate and subjected to activation annealing, thereby preventing the occurrence of surface roughness.

In a method of manufacturing a silicon carbide semiconductor apparatus described in Patent Literature 4, a high-temperature annealing treatment method is described in which activation annealing is carried out with a film obtained by carbonizing a resist layer formed on an active region as a protective film, thereby preventing the occurrence of surface roughness.

In a method of manufacturing a silicon carbide semiconductor apparatus described in Patent Literature 5, a carbon film is formed on an active region by sputtering and used as a protective film. A high-temperature annealing treatment method is described in which the purity of the carbon film is defined, thereby preventing the occurrence of surface roughness by activation annealing.

RELATED ART LIST

Patent Literature

Patent Literature 1: JP-A-2001-68428
Patent Literature 2: JP-A-2000-36470
Patent Literature 3: WO 2005-076327
Patent Literature 4: JP-A-2007-281005
Patent Literature 5: JP-A-2005-353771

SUMMARY OF INVENTION

Technical Problem

As described above, in the high-temperature annealing treatment method described in Patent Literatures 1 to 5, in order to prevent the surface roughness of the silicon carbide substrate, a carbon film is formed as a protective film on the surface of the silicon carbide substrate and subjected to a high-temperature annealing treatment, thereby suppressing the surface roughness or bunching of the silicon carbide substrate. However, in the high-temperature annealing treatment method described in Patent Literatures 1 to 5, there is a problem in that the occurrence of surface roughness or bunching of the silicon carbide substrate is insufficiently suppressed.

The present invention has been achieved in consideration of the above-described situation, and an object of the invention is to provide a method of manufacturing a silicon carbide semiconductor apparatus which provides a smooth silicon carbide surface while maintaining a high impurity activation ratio.

Solution to the Problem

The inventors have studied a mechanism whereby a protective film is provided on a silicon carbide surface and a high-temperature annealing treatment is carried out, and found that, when adhesiveness and denseness between the silicon carbide surface and the overlying protective film are insufficient, the effect of suppressing the surface roughness is degraded. The inventors have also studied a method that is capable of suppressing the surface roughness of the silicon carbide substrate, and found that a carbon film (also including a DLC film) formed by a sputtering method or a CVD method can be used as a protective film, and a two-step heating treatment in which preliminary heating (first step) and activation annealing (second step) are continuously carried out can be used as a high-temperature annealing treatment of the silicon carbide substrate, thereby obtaining a smooth silicon carbide surface while maintaining a high impurity activation ratio, and completed the invention.

That is, the invention is as follows.

(1) A method of manufacturing a silicon carbide semiconductor apparatus which forms an impurity region in a surface layer of a silicon carbide substrate includes the steps of implanting an impurity into the surface layer of the silicon carbide substrate, forming a carbon film on the surface of the silicon carbide substrate, preliminarily heating the silicon carbide substrate with the carbon film as a protective film, and thermally activating the silicon carbide substrate with the carbon film as a protective film.

(2) In the method described in (1), the carbon film is a carbon film formed by sputtering, or a carbon film or a DLC (diamond-like carbon) film formed by CVD.

(3) In the method described in (1) or (2), the preliminary heating and the thermal activation are continuously carried out using the same heating furnace, and the preliminary heating and the thermal activation are a continuous two-step heat treatment.

(4) In the method described in (3), the two-step heat treatment has a temperature elevating step of elevating a temperature to a heat treatment temperature of the thermal activation after the heat treatment of the preliminary heating ends.

(5) In the method described in any one of (1) to (4), the preliminary heating is carried out at a heating temperature of 800 to 1200° C. for a heating time of 10 to 60 minutes, and the thermal activation is carried out at a heating temperature of 1600 to 2000° C. for a heating time of 1 to 5 minutes.

(6) In the method described in any one of (1) to (5), the preliminary heating and the thermal activation are carried out in an atmosphere equal to or lower than $1 \times 10^{-2}$ Pa.

(7) The method described in any one of (1) to (6) further includes the step of, after the step of thermal activation, removing the carbon film.

Advantageous Effects of the Invention

The method of manufacturing a silicon carbide semiconductor apparatus of the invention includes the steps of preliminarily heating and thermally activating the silicon carbide substrate with the carbon film as a protective film. That is, in activating an impurity, a two-step heat treatment is carried out such that preliminary heating is carried out as a first step and thermal activation is then carried out as a second step. In this way, the silicon carbide substrate is preliminarily heated before thermal activation, such that the carbon film as a protective film can be densified to form a film having high adhesion. Thermal activation is carried out with the carbon film having high contact subjected to preliminary heating as a protective film, such that it is possible to prevent Si atoms from being vaporized from the silicon carbide substrate surface, thereby suppressing roughness or bunching of the silicon carbide substrate surface. Therefore, it is possible to manufacture a silicon carbide semiconductor apparatus which provides a smooth silicon carbide surface while maintaining a high impurity activation ratio.

DESCRIPTION OF THE EMBODIMENTS

Figure 1A:
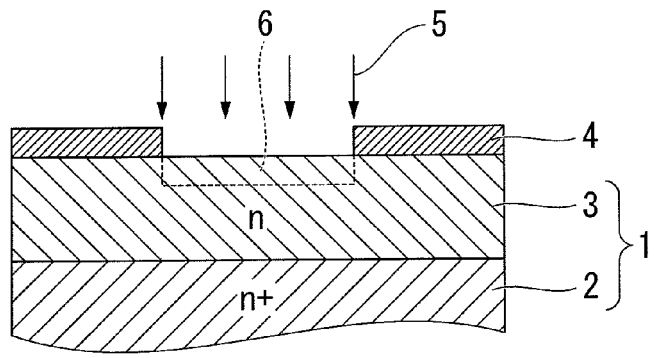
FIG. 1A is a process sectional view showing a method of manufacturing a silicon carbide semiconductor apparatus of this embodiment.

Hereinafter, a method of manufacturing a silicon carbide semiconductor apparatus as an embodiment to which the invention is applied will be described in detail with reference to the drawings. In order to facilitate understanding of the characteristics, in the drawings which are used in the following description, for convenience, characteristic portions may be expanded, and the dimensional ratio or the like of each component may be different from that of each portion of an actual semiconductor apparatus.

FIGS. 1A to 1D are process sectional views showing a method of manufacturing a silicon carbide semiconductor apparatus of this embodiment. The method of manufacturing a silicon carbide semiconductor apparatus of this embodiment schematically includes a step (impurity implantation step) of implanting an impurity into the surface layer of a silicon carbide substrate, a step (protective film forming step) of forming a carbon film on the surface of the silicon carbide substrate, a step (preliminary heating step) of preliminarily heating the silicon carbide substrate with the carbon film as a protective film, and a step (thermal activation step) of thermally activating the silicon carbide substrate with the carbon film as a protective film, and a step (protective film removing step) of removing the carbon film. Thus, an impurity region is formed in the surface layer of the silicon carbide substrate.

(Impurity Implantation Step)

First, in the impurity implantation step, an impurity is implanted into the surface layer of the silicon carbide substrate. Specifically, first, as shown in FIG. 1A, an epitaxial substrate 1 in which an n-type epitaxial layer 3 is grown on an n+-type silicon carbide substrate 2 is used as the silicon carbide substrate. It is preferable that the epitaxial substrate 1 have a smooth surface having slight surface roughness of, for example, Ra<1 nm.

Next, a mask 4 for impurity implantation is formed on the surface of the epitaxial layer 3. The mask 4 partially covers the surface of the epitaxial layer 3 and has an opening in a region where a p-type region (impurity region) will be formed by impurity implantation. As an impurity for forming a p-type region, for example, aluminum (Al) ions 5 are implanted into the surface layer of the epitaxial layer 3 exposed from the opening using six types of acceleration voltage in multiple steps. Specifically, ion implantation of six steps in total is carried out with the acceleration voltage of 240 kV, 150 kV, 95 kV, 55 kV, 27 kV, and 10 kV (six-step implantation method). The implanted Al concentration is, for example, $2 \times 10^{19}$ cm$^{-3}$ or $2 \times 10^{20}$ cm$^{-3}$. With this impurity implantation step, as shown in FIG. 1A, an impurity-implanted layer 6 is foamed.

(Protective Film Forming Step)

Figure 1B:
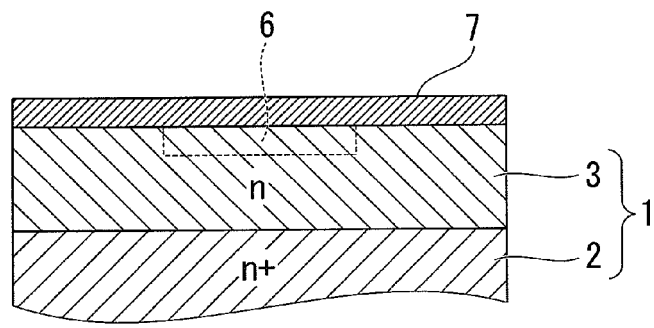
FIG. 1B is a process sectional view showing a method of manufacturing a silicon carbide semiconductor apparatus of this embodiment.

Next, as shown in FIG. 1B, in the protective film forming step, a carbon film is formed on the surface of the epitaxial substrate (silicon carbide substrate) 1. Specifically, first, the mask 4 which is used in impurity implantation is removed. Subsequently, a carbon film 7 is formed on the epitaxial layer 3 and the impurity-implanted layer 6.

The carbon film 7 is formed by sputtering. In a method of forming the carbon film 7 by sputtering, for example, the epitaxial substrate 1 is attached to the inside of the chamber of a sputter deposition apparatus, vacuuming is carried out, Ar gas is introduced to heat the epitaxial substrate 1 to 100° C., and a DC bias and high-frequency power of 1.25 kW are applied to a target of a carbon plate to carry out sputter deposition.

The film thickness of the carbon film 7 is preferably in a range of 20 to 500 nm, more preferably in a range of 50 to 200 nm, and particularly preferably in a range of 70 to 150 nm. If the film thickness of the carbon film 7 is smaller than 20 nm, it is undesirable in that, in the thermal activation step described below, the function as a protective film is insufficient. If the film thickness of the carbon film 7 exceeds 500 nm, it is undesirable in that warping or cracking occurs in the substrate. It is undesirable in that, in the protective film removing step described below, it is difficult to remove the carbon film 7. Meanwhile, if the film thickness of the carbon film 7 is within the above-described range, no warping or cracking occurs in the substrate at the time of thermal activation, it is possible to suppress Si elements from being sublimated from the surface of the epitaxial substrate 1, and it becomes easy to remove the carbon film 7 in the protective film removing step.

The carbon film 7 is not particularly limited to a carbon film formed by sputtering, and may be a carbon film or a DLC (diamond-like carbon) film formed by CVD. In particular, the carbon film 7 formed by sputtering is preferably used from the viewpoint of excellent denseness. With the protective film forming step, as shown in FIG. 1B, the carbon film 7 is formed.

(Preliminary Heating Step)

Next, as shown in FIG. 1B, the epitaxial substrate 1 is preliminarily heated with the carbon film 7 as a protective film. Here, if the next step of thermal activation is carried out without preliminarily heating, it is considered that adhesiveness of the surface of the epitaxial substrate 1 and the carbon film 7 may be insufficient. For this reason, a gap is generated between the surface of the epitaxial substrate 1 and the carbon film 7. The Si atoms are extricated from the gap, such that the surface of the epitaxial substrate 1 after thermal activation is roughened. As described above, if the formed carbon film 7 is used in thermal activation while unprocessed, it is not possible to sufficiently fulfill the function as a protective film.

Accordingly, the inventors have found that preliminary heating may be carried out before thermal activation, thereby increasing the denseness of the carbon film 7. That is, it is thought that the formed carbon film 7 is preliminarily heated to densify the carbon film 7, thereby increasing the denseness of the surface of the epitaxial substrate 1 and the carbon film 7. Thus, it is considered that it is possible to suppress the Si atoms from being extricated from the gap between the substrate and the carbon film at the time of thermal activation and to suppress roughness of the surface of the epitaxial substrate 1 after thermal activation.

In this embodiment, preliminary heating is carried out by electron beam heating in an atmosphere at a reduced pressure equal to or lower than $1 \times 10^{-2}$ Pa using a reduced-pressure heating furnace. The heating temperature is preferably in a range of 800 to 1200° C., more preferably in a range of 900 to 1100° C., and most preferably in a range of 950 to 1050° C. If the heating temperature is lower than 800° C., it is undesirable in that the denseness of the carbon film 7 is insufficient, such that the adhesiveness of the surface of the epitaxial substrate 1 and the carbon film 7 is insufficient. If the heating temperature exceeds 1100° C., it is undesirable in that the Si atoms may be extricated before the adhesiveness of the surface of the epitaxial substrate 1 and the carbon film 7 is stabilized.

The heating time is preferably 10 to 60 minutes, more preferably 30 to 60 minutes, and particularly preferably 30 to 45 minutes. If the heating time is less than 10 minutes, it is undesirable in that the denseness and adhesiveness of the carbon film 7 are not stabilized. If the heating time exceeds 60 minutes, it is undesirable in that the process time is extended, causing an increase in production cost. With the preliminary heating step, a dense carbon film 7' shown in FIG. 1C is formed.

(Thermal Activation Step)

Figure 1C:
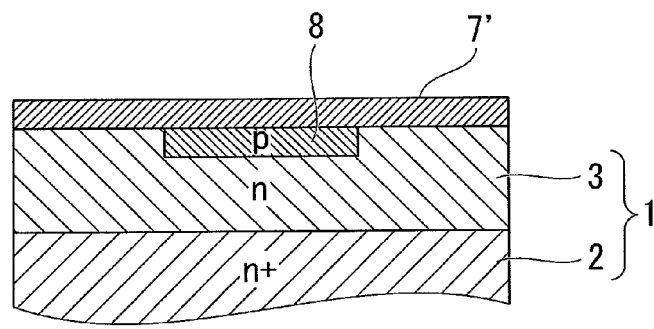
FIG. 1C is a process sectional view showing a method of manufacturing a silicon carbide semiconductor apparatus of this embodiment.

Next, as shown in FIG. 1C, after preliminary heating, the epitaxial substrate 1 is thermally activated with the carbon film 7' as a protective film. Thermal activation is carried out by electron beam heating in an atmosphere at a reduced pressure equal to or lower than $1 \times 10^{-2}$ Pa using a reduced-pressure heating furnace. The heating temperature is preferably in a range of 1600 to 2000° C., more preferably in a range of 1700 to 1900° C., and most preferably in a range of 1700 to 1850° C. If the heating temperature is lower than 1600° C., it is undesirable in that implanted impurity activation is insufficient. If the heating temperature exceeds 2000° C., it is undesirable in that, even when a protective film is provided, the surface of the epitaxial substrate 1 may be carbonized and the surface may be roughened. In the thermal activation step, heat treatment is carried out at a higher heating temperature than in the preliminary heating step.

The heating time is preferably 1 to 5 minutes, more preferably 1 to 3 minutes, and particularly preferably 1 to 2 minutes. If the heating time is less than 1 minute, it is undesirable in that impurity activation is insufficient. If the heating time exceeds 5 minutes, it is undesirable in that, even when a protective film is provided, the surface of the epitaxial substrate 1 may be carbonized and the surface may be roughened.

Figure 2:
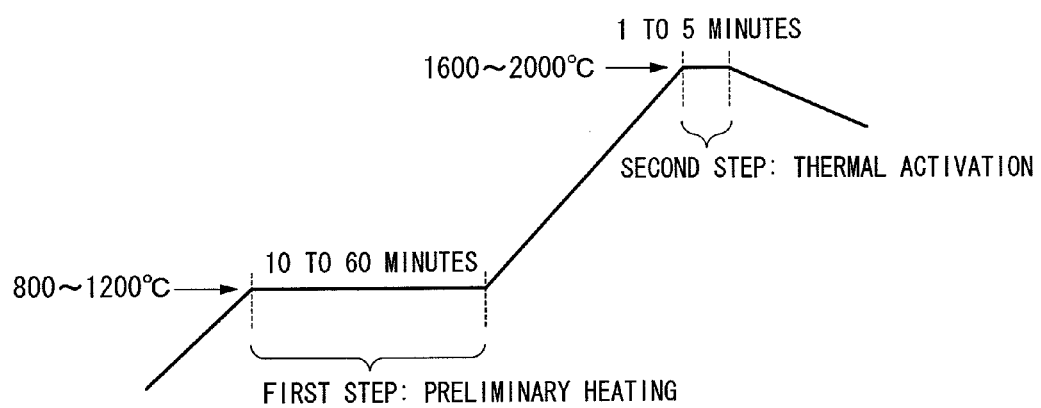
FIG. 2 is a diagram showing the profile of a two-step heat treatment having continuous heat treatment of preliminary heating and thermal activation of this embodiment.

In this embodiment, it is desirable that preliminary heating (first step) and thermal activation (second step) be continuously carried out using the same heating furnace. That is, it is desirable that a two-step heat treatment (hereinafter, referred to as two-step annealing) be carried out with a two-step heat treatment profile of continuous preliminary heating and thermal activation using the same heating furnace, as shown in FIG. 2. With the two-step annealing, in the first step, the carbon film 7' is obtained such that the adhesiveness and denseness of the surface of the epitaxial substrate 1 and the carbon film 7 formed by sputtering are stabilized, and in the second step, impurity activation of the impurity-implanted layer 6 can be carried out with the carbon film 7' as a protective film. In the two-step annealing, continuous heat treatment is carried out using the same heating furnace, making it possible to efficiently carry out heat treatment in a clean environment.

In this embodiment, as shown in FIG. 2, it is desirable to provide a temperature elevating step of elevating the temperature in the furnace to the heat treatment temperature of thermal activation without lowering the temperature in the furnace after heat treatment of preliminary heating. In this way, heat treatment is continuously carried out, thereby reducing the heat treatment time and suppressing an increase in energy cost. In the two-step annealing, the temperature in the furnace may be temporarily lowered after heat treatment of preliminary heating and then elevated to the heating temperature before thermal activation. With the thermal activation, as shown in FIG. 1C, the impurity region 8 is formed.

(Protective Film Removing Step)

Figure 1D:
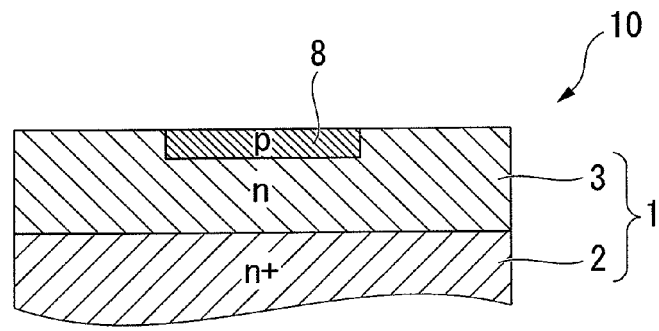
FIG. 1D is a process sectional view showing a method of manufacturing a silicon carbide semiconductor apparatus of this embodiment.

Next, as shown in FIG. 1D, the carbon film 7' used as a protective film is removed. The carbon film 7' is removed by carbonizing the carbon film through thermal oxidation in an oxygen atmosphere. Specifically, a substrate is set in a thermal oxidation furnace, and the condition that oxygen is supplied at a flow rate of 3.5 L/min to heat the substrate at 1125° C. for 90 minutes, thereby removing the carbon film 7' on the epitaxial layer 3 and the impurity-implanted layer 6. In this embodiment, the activation ratio of aluminum is about 80%, and sufficient activation is carried out. With the protective film removing step, it is possible to manufacture a silicon carbide semiconductor substrate (wafer) 10 having an impurity region 8 of a high activation ratio shown in FIG. 1D and a smooth surface. Then, for example, a Schottky diode is formed in the silicon carbide semiconductor substrate 10 including that surface, thereby manufacturing a silicon carbide semiconductor apparatus.

As described above, according to the method of manufacturing a silicon carbide semiconductor apparatus of this embodiment, the epitaxial substrate 1 is preliminarily heated before thermal activation to densify the carbon film 7 formed by sputtering, thereby increasing the adhesiveness to the epitaxial substrate 1. Then, thermal activation is carried out with the carbon film 7' having high adhesiveness subjected to preliminary heating as a protective film, such that it is possible to effectively suppress vaporization of the Si atoms from the surface of the epitaxial substrate 1, thereby suppressing roughness or bunching of the substrate surface. Therefore, it is possible to manufacture the silicon carbide semiconductor substrate 10 having a smooth surface while maintaining a high impurity activation ratio.

The technical scope of the invention is not limited to the foregoing embodiment, and various changes and modifications may be made without departing from the spirit of the invention. For example, although in this embodiment the preliminary heating step and the thermal activation step are carried out using a reduced-pressure heating furnace, a heating furnace in an inert gas atmosphere, such as argon (Ar), may be used. Although in this embodiment an electron beam heating method is used, the invention is not limited thereto, and a lamp heating or high-frequency method may be used.

Although in this embodiment the carbon film 7' is removed through thermal oxidation, the carbon film 7' may be removed through plasma treatment using oxygen or ozonation treatment.

EXAMPLES

Hereinafter, the effects of the invention will be specifically described in connection with Examples. It should be noted that the invention is not limited to Examples.

Example 1

First, Al ions are implanted into an epitaxial substrate in which an epitaxial layer is grown on an n-type SiC substrate. As the implantation condition of the Al ions, a six-step implantation method (six steps in total with the acceleration voltage 240 kV, 150 kV, 95 kV, 55 kV, 27 kV, and 10 kV) was used. The Al concentration after implantation was $2 \times 10^{19}$ cm$^{-3}$. After the implantation of the Al ions, a carbon film was formed by sputtering. As the sputtering condition, 1.25 kW of DC bias was used. The thickness of the carbon film was 100 nm.

Figure 3:
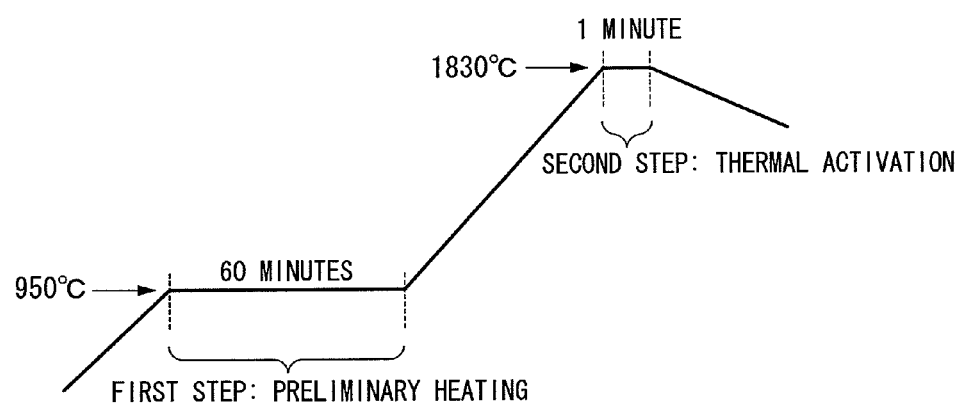
FIG. 3 is a diagram showing the profile of a two-step heat treatment having continuous heat treatment of preliminary heating and thermal activation of Example of the invention.

Next, the pressure was reduced to be equal to or lower than $1 \times 10^{-3}$ to $5 \times 10^{-3}$ Pa, and a two-step heating treatment was carried out. FIG. 3 shows a heat treatment profile of preliminary heating (first step) and activation annealing (second step) of this embodiment. As shown in FIG. 3, preliminary heating was carried out as the first step under the condition of a temperature of 950° C. and holding time of 60 minutes, such that the adhesiveness and denseness of the silicon carbide substrate surface and the carbon film formed by sputtering were stabilized. Next, thermal activation of the impurity was carried out as the second step under the condition of a temperature of 1830° C. and holding time of 1 minute. Finally, the carbon film was carbonized and removed through thermal oxidation (1125° C. and 90 minutes) in an oxygen atmosphere to manufacture a silicon carbide semiconductor apparatus of Example 1. The aluminum activation ratio of the silicon carbide semiconductor apparatus of Example 1 was about 80%.

Example 2

The same reaction as Example 1 was carried out under the implantation condition of the Al ions of the six-step implantation method (six steps in total with the acceleration voltage 240 kV, 150 kV, 95 kV, 55 kV, 27 kV, and 10 kV (the dose amount is different from $2 \times 10^{19}$ cm$^{-3}$)), except that the Al concentration after implantation was $2 \times 10^{20}$ cm$^{-3}$, to manufacture a silicon carbide semiconductor apparatus of Example 2. The aluminum activation ratio of the silicon carbide semiconductor apparatus of Example 2 was about 80%.

Comparative Example 1

The same reaction as in Example 1 was carried out, except that thermal activation was carried out through one-step heat treatment of the related art without preliminary heating before thermal activation, to manufacture a silicon carbide semiconductor apparatus of Comparative Example 1. The aluminum activation ratio of the silicon carbide semiconductor apparatus of Comparative Example 1 was about 80%.

Comparative Example 2

The same reaction as in Example 2 was carried out, except that thermal activation was carried out by one-step heat treatment of the related art without preliminary heating before thermal activation, to manufacture a silicon carbide semiconductor apparatus of Comparative Example 2. The aluminum activation ratio of the silicon carbide semiconductor apparatus of Comparative Example 2 was about 80%.

(Comparison Result of Surface State)

The surface state of the SiC layer of the silicon carbide semiconductor apparatus of each of Examples 1 and 2 subjected to a two-step annealing by the method of the invention was compared to the surface state of the SiC layer of the silicon carbide semiconductor apparatus of each of Comparative Examples 1 and 2 without preliminary heating before thermal activation. FIGS. 4A, 4B, 5A, and 5B are diagrams showing the surface morphology through an atomic force microscope (AFM) of samples of Examples 1 and 2 and Comparative Examples 1 and 2 subjected to impurity activation treatment. The scanning area in each of FIGS. 4A to 5B is 2 μm×2 μm. The scale of the height is described in the drawings.

Figure 4A:
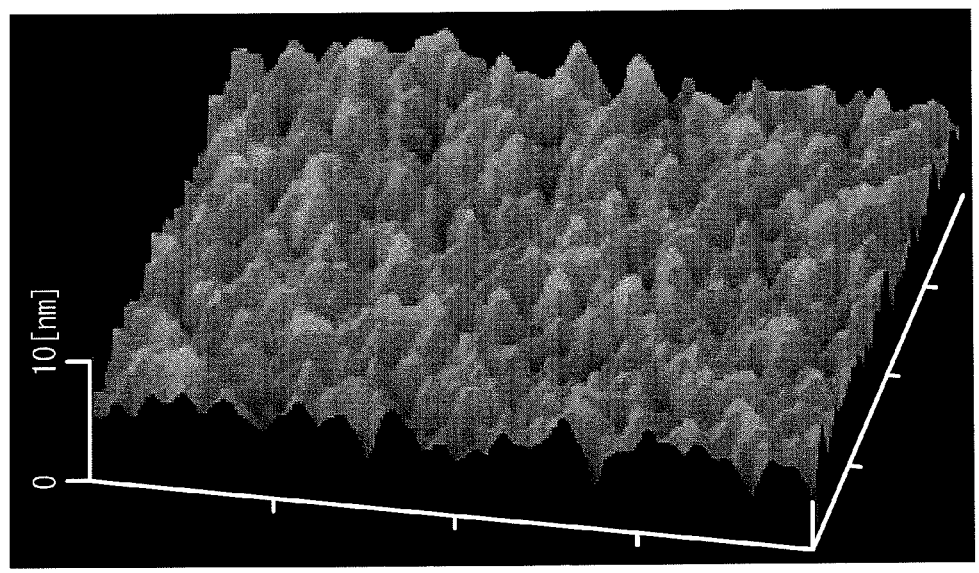
FIG. 4A is a diagram showing surface morphology through an atomic force microscope (AFM) observation and showing an observation result of Comparative Example 1.
Figure 4B:
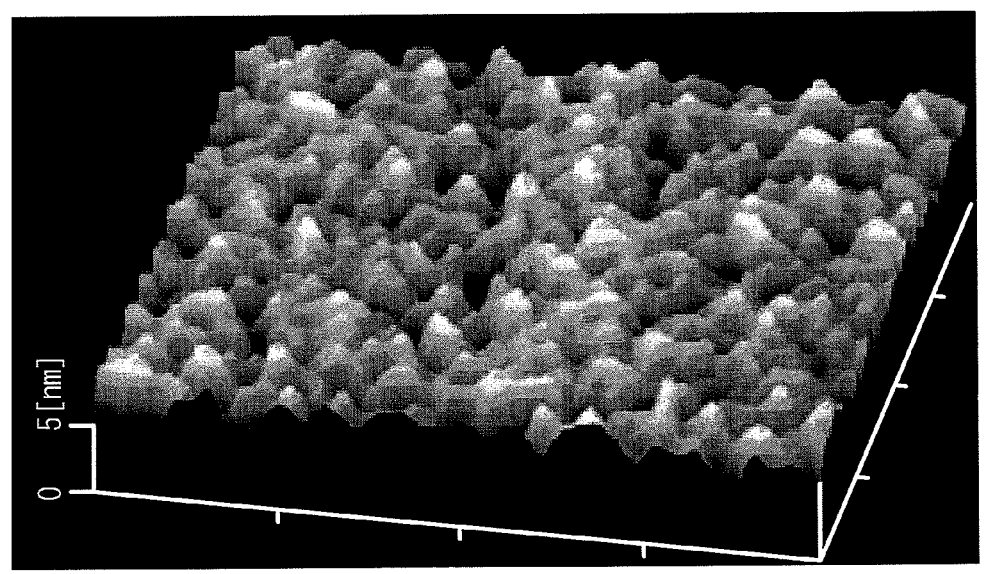
FIG. 4B is a diagram showing surface morphology through an atomic force microscope (AFM) observation and showing an observation result of Example 1.
Figure 5A:
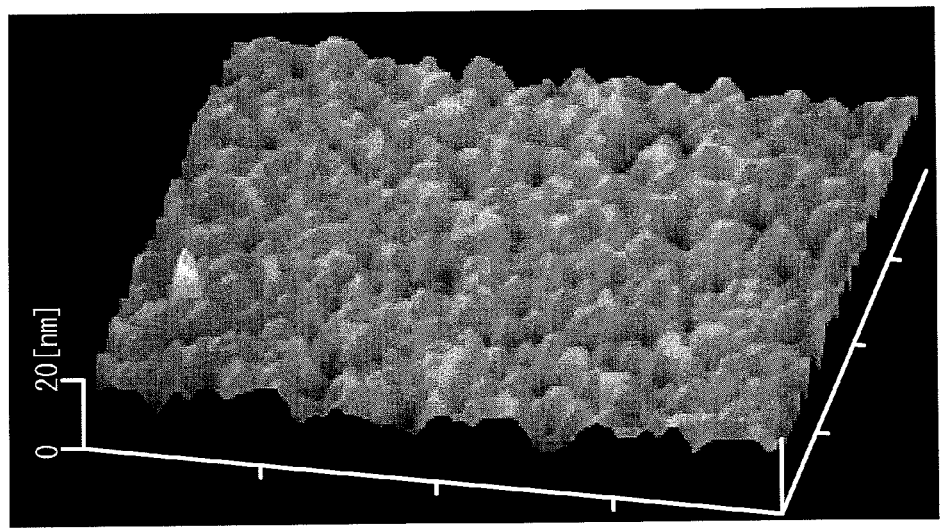
FIG. 5A is a diagram showing surface morphology through an atomic force microscope (AFM) observation and showing an observation result of Comparative Example 2.
Figure 5B:
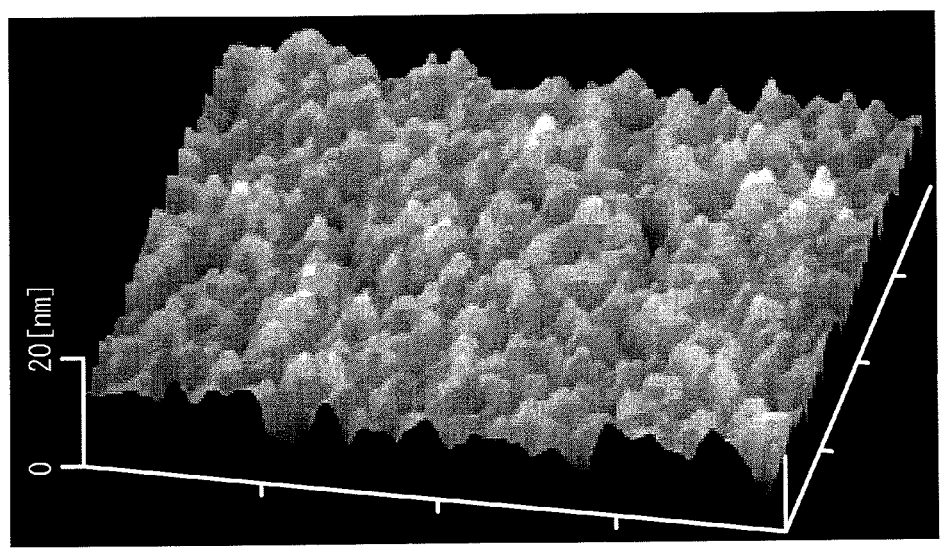
FIG. 5B is a diagram showing surface morphology through an atomic force microscope (AFM) observation and showing an observation result of Example 2.

First, in comparison when the Al concentration after implantation was $2\times10^{19}$ cm$^{-3}$, while Rms of Comparative Example 1 shown in FIG. 4A was 1.409 nm, Rms of Example 1 shown in FIG. 4B was 1.149 nm. Next, in comparison when the Al concentration after implantation was $2\times10^{20}$ cm$^{-3}$, while Rms of Comparative Example 2 shown in FIG. 5A was 2.933 nm, Rms of Example 2 shown in FIG. 5B was 2.686 nm.

Figure 6:
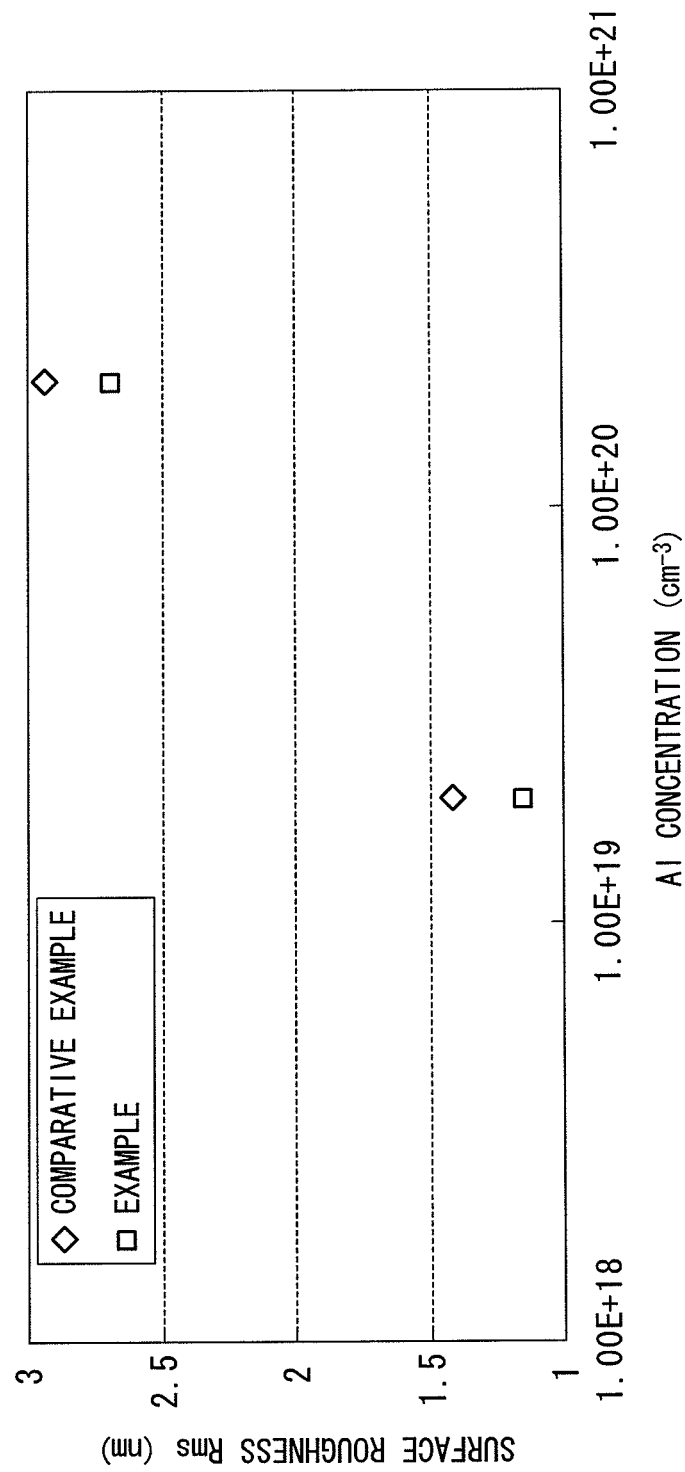
FIG. 6 is a diagram showing a comparison result of surface roughness of Example and surface roughness of Comparative Example.

As shown in FIG. 6, even when an ion implantation amount is different, in comparison of Comparative Examples 1 and 2 where one-step thermal activation of the related art was carried out and Examples 1 and 2 where preliminary heating was carried out before thermal activation while the carbon film formed by sputtering was used as a protective film, it was confirmed that the value (Rms) of surface roughness in the two-step heat treatment method was small.

As described above, according to the invention, the carbon film is formed as a protective film on the silicon carbide substrate by sputtering, and the two-step thermal activation method is carried out, such that it is possible to suppress roughness or bunching of the silicon carbide surface due to sublimation of a material (for example, Si, C, dopant) in the silicon carbide layer.

INDUSTRIAL APPLICABILITY

The invention can be applied to a method of manufacturing a silicon carbide semiconductor apparatus.

REFERENCE SIGNS LIST

1: epitaxial substrate (silicon carbide substrate)
2: n$^+$-type silicon carbide substrate
3: n-type epitaxial layer
4: mask 4
5: aluminum ion
6: impurity-implanted layer
7, 7': carbon film
8: impurity region
10: silicon carbide semiconductor substrate

The invention claimed is:

1. A method of manufacturing a silicon carbide semiconductor apparatus which forms an impurity region in a surface layer of a silicon carbide substrate, comprising the steps of:
   implanting an impurity into the surface layer of the silicon carbide substrate;
   forming a carbon film on the surface of the silicon carbide substrate;
   preliminarily heating the silicon carbide substrate with the carbon film as a protective film; and
   thermally activating the silicon carbide substrate with the carbon film as a protective film,
   wherein the preliminary heating is carried out at a heating temperature of 800 to 1200° C. for a heating time of 10 to 60 minutes, and
   the thermal activation is carried out at a heating temperature of 1600 to 2000° C. for a heating time of 1 to 5 minutes.

2. The method according to claim 1,
   wherein the carbon film is a carbon film formed by sputtering, or a carbon film or a DLC (diamond-like carbon) film formed by CVD.

3. The method according to claim 1,
   wherein the preliminary heating and the thermal activation are continuously carried out using the same heating furnace, and
   the preliminary heating and the thermal activation are a continuous two-step heat treatment.

4. The method according to claim 3,
   wherein the two-step heat treatment has a temperature elevating step of elevating a temperature to a heat treatment temperature of the thermal activation after the heat treatment of the preliminary heating ends.

5. The method according to claim 1,
   wherein the preliminary heating and the thermal activation are carried out in an atmosphere equal to or lower than $1\times10^{-2}$ Pa.

6. The method according to claim 1, further comprising the step of, after the step of thermal activation:
   removing the carbon film.

* * * * *